US010544040B2

(12) United States Patent
Long et al.

(10) Patent No.: US 10,544,040 B2
(45) Date of Patent: Jan. 28, 2020

(54) METHOD AND STRUCTURE FOR PREVENTING SOLDER FLOW INTO A MEMS PRESSURE PORT DURING MEMS DIE ATTACHMENT

(71) Applicant: DunAn Microstaq, Inc., Austin, TX (US)

(72) Inventors: Wayne C. Long, Austin, TX (US); Joe A. Ojeda, Austin, TX (US); Joseph L. Nguyen, Austin, TX (US)

(73) Assignee: DunAn Microstaq, Inc., Austin, TX (US)

( * ) Notice: Subject to any disclaimer, the term of this patent is extended or adjusted under 35 U.S.C. 154(b) by 90 days.

(21) Appl. No.: 15/909,431

(22) Filed: Mar. 1, 2018

(65) Prior Publication Data

US 2018/0319656 A1 Nov. 8, 2018

Related U.S. Application Data

(60) Provisional application No. 62/502,282, filed on May 5, 2017.

(51) Int. Cl.
*B23K 31/02* (2006.01)
*B81C 3/00* (2006.01)
(Continued)

(52) U.S. Cl.
CPC ............ *B81C 3/001* (2013.01); *B23K 1/0008* (2013.01); *B23K 35/224* (2013.01);
(Continued)

(58) Field of Classification Search
CPC ............... B81C 3/001; B81C 1/00952; B81C 2203/035; B81C 3/00; H05K 3/3457; G01K 15/005; G01K 13/02; G01L 9/0048; B23K 1/0008; B23K 1/00–206; B23K 2101/36–42; B23K 35/224
(Continued)

(56) References Cited

U.S. PATENT DOCUMENTS 4,976,813 A 12/1990 Salensky et al.
5,635,764 A * 6/1997 Fujikawa ............ H01L 23/4924
257/766

(Continued)

FOREIGN PATENT DOCUMENTS

EP 0844809 A2 5/1998
JP 09292298 A * 11/1997
WO WO2004/001358 A1 * 12/2003

*Primary Examiner* — Kiley S Stoner
(74) *Attorney, Agent, or Firm* — MacMillan, Sobanski & Todd, LLC

(57) ABSTRACT

A method of attaching a MEMS die to a mounting surface includes coating an inside surface of a pressure port of a fluid inlet member with a layer of solder mask, the fluid inlet member having a first axial end, a second axial end, and a port opening of the pressure port formed in the second axial end of the fluid inlet member. A solder preform is disposed on the mounting surface of the fluid inlet member and a MEMS die is disposed on the solder preform. The solder preform is heated in a re-flow operation to attach the MEMS die to the mounting surface, wherein the solder mask within the pressure port prevents molten solder from entering the pressure port during the re-flow operation.

15 Claims, 8 Drawing Sheets

(51) Int. Cl.
  *B81C 1/00* (2006.01)
  *G01K 13/02* (2006.01)
  *G01K 15/00* (2006.01)
  *H05K 3/34* (2006.01)
  *B23K 35/22* (2006.01)
  *B23K 1/00* (2006.01)

(52) U.S. Cl.
  CPC .......... *B81C 1/00952* (2013.01); *G01K 13/02* (2013.01); *G01K 15/005* (2013.01); *H05K 3/3457* (2013.01); *B81C 2203/035* (2013.01)

(58) Field of Classification Search
  USPC ......... 228/179.1–180.22, 214–216, 56.3, 39, 228/245–262
  See application file for complete search history.

(56) References Cited

U.S. PATENT DOCUMENTS

| | | | | |
|---|---|---|---|---|
| 5,829,665 | A * | 11/1998 | Yoneyama | B23K 1/20 228/124.1 |
| 6,550,337 | B1 * | 4/2003 | Wagner | G01L 9/0042 73/715 |
| 7,749,899 | B2 * | 7/2010 | Clark | H01L 21/76898 257/E21.585 |
| 9,140,613 | B2 | 9/2015 | Arunasalam et al. | |
| 2005/0089283 | A1 * | 4/2005 | Michael | B81C 1/00293 385/94 |
| 2009/0282925 | A1 * | 11/2009 | Machir | G01L 19/148 73/756 |
| 2010/0089169 | A1 * | 4/2010 | Koehler | G01L 19/143 73/756 |
| 2010/0089979 | A1 * | 4/2010 | Irslinger | B23K 1/19 228/176 |
| 2011/0044017 | A1 * | 2/2011 | Ono | H01L 23/055 361/771 |
| 2011/0059567 | A1 * | 3/2011 | Wu | B81C 1/00269 438/51 |
| 2012/0048025 | A1 * | 3/2012 | Usui | G01L 19/147 73/754 |
| 2012/0049300 | A1 * | 3/2012 | Yamaguchi | G01L 19/147 257/417 |
| 2012/0168940 | A1 * | 7/2012 | Bieck | H01L 21/31 257/737 |
| 2012/0298993 | A1 * | 11/2012 | Nagata | H01L 23/481 257/48 |
| 2013/0098160 | A1 * | 4/2013 | Rozgo | G01L 9/0041 73/723 |
| 2014/0216163 | A1 * | 8/2014 | Thiele | G01L 19/0645 73/727 |
| 2015/0128715 | A1 * | 5/2015 | Kamimura | G01L 19/0084 73/754 |
| 2016/0345106 | A1 * | 11/2016 | Pahl | H04R 19/04 |
| 2017/0041692 | A1 * | 2/2017 | Watson | H04R 1/023 |
| 2018/0127269 | A1 * | 5/2018 | Long | B23K 1/0016 |
| 2018/0209863 | A1 * | 7/2018 | Golly | G01L 19/146 |
| 2018/0319654 | A1 * | 11/2018 | Long | B81B 7/0029 |
| 2019/0092630 | A1 * | 3/2019 | Long | B23K 1/0016 |
| 2019/0132960 | A1 * | 5/2019 | Nakamura | H05K 3/34 |

* cited by examiner

METHOD AND STRUCTURE FOR PREVENTING SOLDER FLOW INTO A MEMS PRESSURE PORT DURING MEMS DIE ATTACHMENT

BACKGROUND OF THE INVENTION

This invention relates in general to a Micro Electro Mechanical Systems (MEMS) die. In particular, this invention relates to an improved attachment platform and method for attaching the MEMS die to a mounting surface that prevents solder flow into a MEMS pressure port formed in the mounting surface during the attachment of the MEMS die to the mounting surface.

According to a known method, solder paste or solder preform is placed onto a mounting surface, such as a pedestal of a valve, fluid control device, fluid system parameter sensing device, and the like. A MEMS die is then placed onto the solder paste or the solder preform and the solder paste or the solder preform is heated in a re-flow operation.

During attachment of the MEMS die, such as a MEMS die configured as a MEMS fluid pressure sensor, to a mounting surface, undesirable mechanical stress may be generated and transmitted to the MEMS fluid pressure sensor. Such mechanical stress may adversely affect the MEMS fluid pressure sensor's performance.

For example, the MEMS fluid pressure sensor may use a Wheatstone bridge strain gauge. Such a MEMS fluid pressure sensor may have a pressure chamber with a flexible wall that deforms in response to fluid pressure in the chamber, thus producing strain. In this context, strain is the response of a system to an applied stress. When a material is loaded with a force, it produces stress, which may then cause the material to deform. As used herein, engineering strain is defined as the amount of deformation in the direction of the applied force divided by the initial length of the material. The strain gauge senses this deformation, and generates an output signal representative of the fluid pressure in the pressure chamber.

In one conventional device, the MEMS fluid pressure sensor is soldered to the mounting surface of the device body or base, and the base then threaded into a housing, such as a Schrader valve housing. As the base is tightened into the housing, applied torque may generate non-transitory stress in the base that is transmitted through the solder to the MEMS fluid pressure sensor, such that the strain gauge detects a strain and will erroneously report a fluid pressure when no fluid pressure is present in the pressure chamber of the MEMS fluid pressure sensor.

According to the known method described above, the MEMS fluid pressure sensor is attached with a thick layer of ductile solder. This thick layer of ductile solder advantageously mechanically isolates the MEMS fluid pressure sensor from mounting surface stress. However, the thicker the solder paste or the solder preform used to attach the MEMS fluid pressure sensor to the mounting surface, the more likely the corresponding MEMS pressure port in the mounting surface will become clogged with solder during a re-flow operation.

Thus, it would be desirable to provide an improved attachment platform and improved method for attaching a MEMS die to a mounting surface that prevents solder flow into a MEMS pressure port formed in the mounting surface during the attachment of the MEMS die to the mounting surface.

SUMMARY OF THE INVENTION

This invention relates to improved methods for attaching a MEMS die to a mounting surface that prevents solder flow into a MEMS pressure port formed in the mounting surface during the attachment of the MEMS die to the mounting surface.

A first embodiment of a method of attaching a MEMS die to a mounting surface includes coating an inside surface of a pressure port of a fluid inlet member with a layer of solder mask, the fluid inlet member having a first axial end, a second axial end, and a port opening of the pressure port formed in the second axial end of the fluid inlet member. A solder preform is disposed on the mounting surface of the fluid inlet member and a MEMS die is disposed on the solder preform. The solder preform is heated in a re-flow operation to attach the MEMS die to the mounting surface, wherein the solder mask within the pressure port prevents molten solder from entering the pressure port during the re-flow operation.

In another embodiment of the method of the invention, the coating step further includes coating a portion of a mounting surface of the fluid inlet member around a periphery of the port opening of the pressure port with a layer of the solder mask, such that the solder mask on the mounting surface of the fluid inlet member around a periphery of the port opening of the pressure port further prevents molten solder from entering the pressure port during the re-flow operation.

Various aspects of this invention will become apparent to those skilled in the art from the following detailed description of the preferred embodiments, when read in light of the accompanying drawings.

DETAILED DESCRIPTION OF THE PREFERRED EMBODIMENTS

Figure 1:
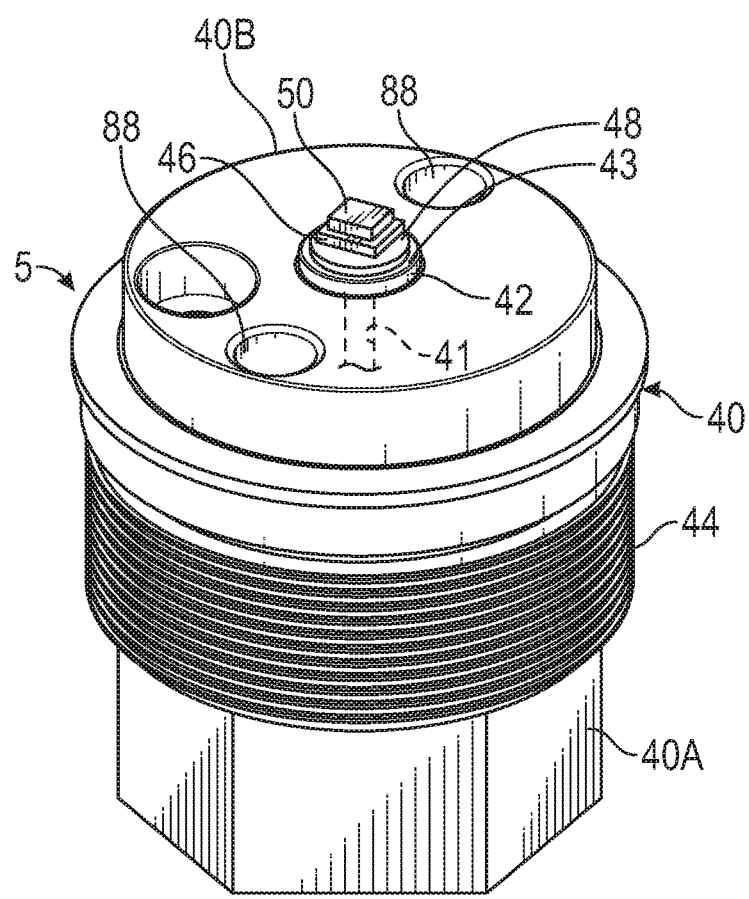
FIG. 1 is a perspective view of a portion of a superheat controller to which the method according to the invention may be applied.

Referring now to the drawings, there is illustrated in FIG. 1 one embodiment of a portion 5 of a superheat controller (SHC) (not shown, but substantially similar to a SHC 10 shown in FIGS. 2 and 3) configured such that the method of the invention may be applied thereto. The portion 5 of the SHC shown in FIG. 1 includes a body or base defining a fluid inlet member 40. The fluid inlet member 40 is similar to a fluid inlet member 18 described below and includes a substantially cylindrical pedestal 42 formed on a first end of the fluid inlet member 40. The pedestal 42 includes a mounting surface 43 (the upwardly facing surface when viewing FIGS. 1 and 5. The fluid inlet member 40 includes a central portion 44 that may include external threads. The illustrated fluid inlet member 40 is formed from brass. Alternatively, the fluid inlet member 40 may be formed form other metals, metal alloys, and non-metal materials.

U.S. Pat. No. 9,140,613 discloses a superheat controller (SHC). The SHC disclosed therein is a single, self-contained, stand-alone device which contains all the sensors, electronics, and intelligence to automatically detect a fluid type, such as refrigerant, and report the superheat of multiple common fluid types used in residential, industrial, and scientific applications. U.S. Pat. No. 9,140,613 is incorporated herein in its entirety.

Figure 2:
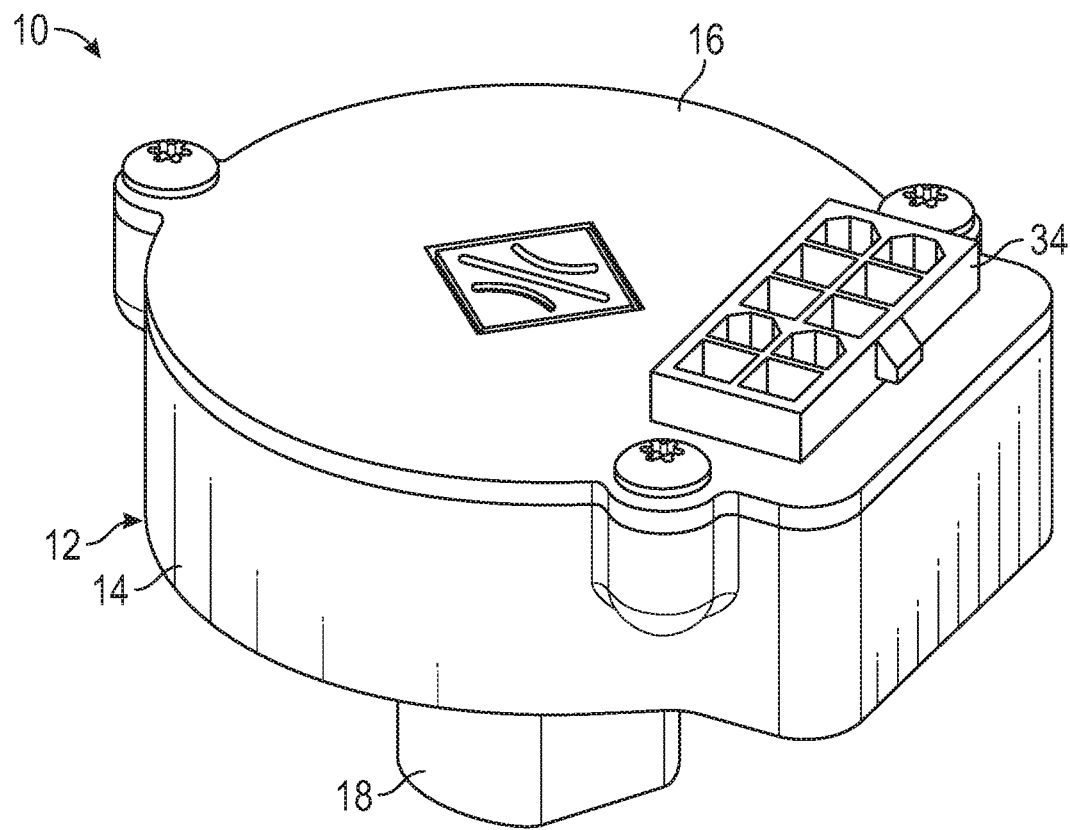
FIG. 2 is a perspective view of a known universal superheat controller.
Figure 3:
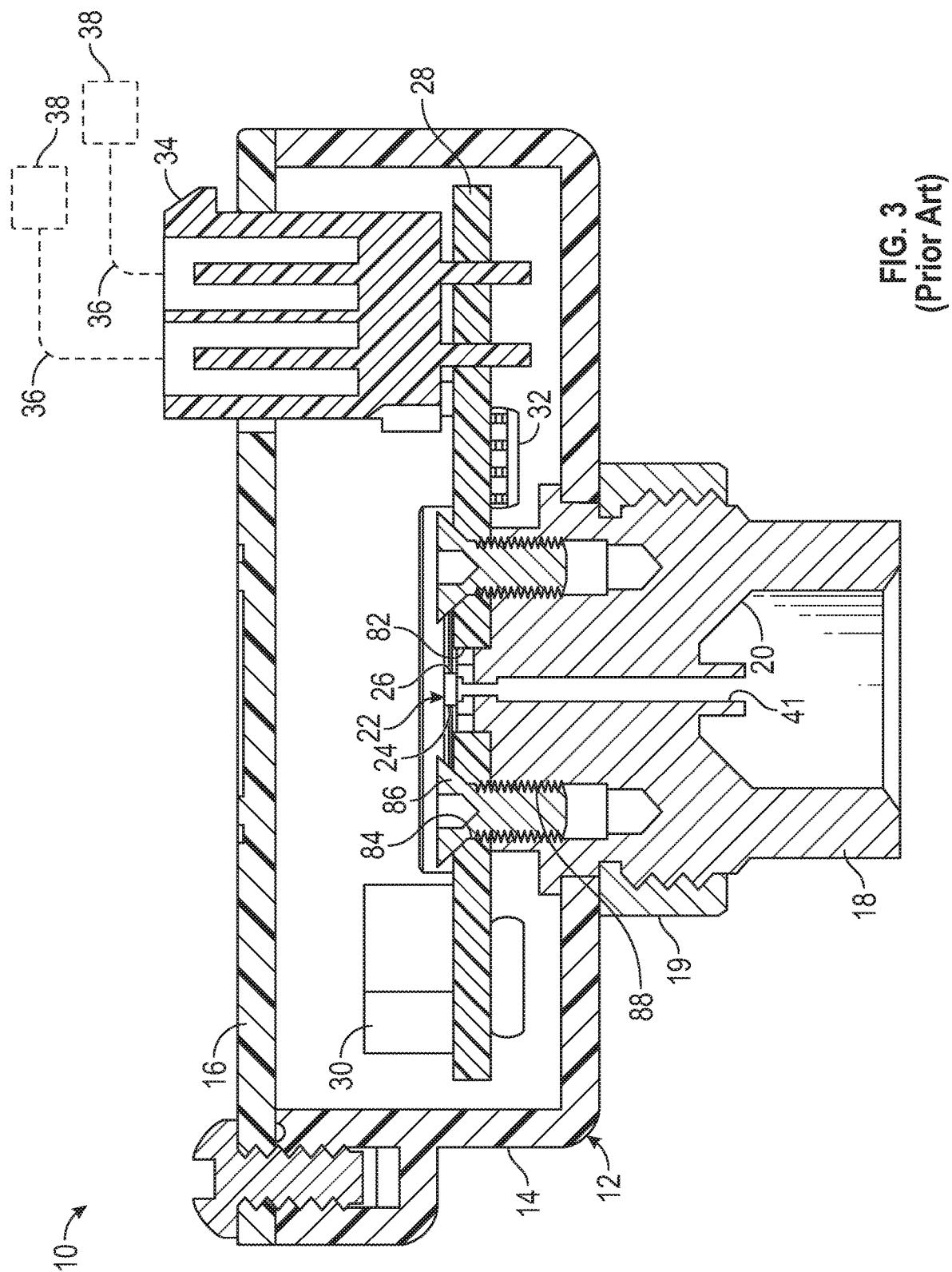
FIG. 3 is a cross sectional view of the known universal superheat controller illustrated in FIG. 2.

FIGS. 2 and 3 herein illustrate a SHC 10, which is similar to the superheat controller disclosed in U.S. Pat. No. 9,140,613. As shown in FIGS. 2 and 3, the SHC 10 includes a housing 12 having a body 14, a cover 16, and the base that defines the fluid inlet member 18. The fluid inlet member 18 may be secured to the housing 12 by a mounting ring 19. The mounting ring 19 attaches the fluid inlet member 18 to the housing 12 portion by a threaded connection. Alternatively, the mounting ring 19 may be attached to the fluid inlet member 18 by any desired method, such as by welding or press fitting. In the embodiment illustrated in FIGS. 2 and 3, the fluid inlet member 18 is a brass fitting having a centrally formed opening that defines a sealing surface 20.

A first embodiment of a pressure port 41 is formed in the fluid inlet member 40 from the mounting surface 43 of the pedestal 42 to a first axial end 40A of the fluid inlet member 40 (see FIG. 1). The pressure port 41 is configured as a bore and may convey pressurized fluid to be measured through the fluid inlet member 40, through a hermetic seal defined by solder, i.e., the hardened solder that results when the solder preform 48 has been heated in a re-flow operation, and into a pressure sensing chamber 46A (see FIGS. 6 and 8) of a MEMS die configured as a pressure sensor die 46, described below.

The SHC 10 includes an integrated pressure and temperature sensor 22 having pressure sensor portion 24 and a temperature sensor portion 26 mounted to a printed circuit board (PCB) 28. A superheat processor 30, a data-reporting or communication module 32, and an Input/Output (IO) module 34 are also mounted to the PCB 28. The IO module 34 is a physical hardware interface that accepts input power and reports data through available hard-wired interfaces, such as wires or cables 36, to the superheat processor 30. Target devices 38 that may be connected to the SHC 10 via the IO module 34 may include additional temperature sensors, laptop and notebook computers, cell phones, memory cards, and any device used in or with conventional end of the line test equipment. Alternatively, the target devices 38 may be connected to the communication module 32 by a wireless connection.

The superheat processor 30 is mounted to the PCB 28 and is a high-resolution, high accuracy device that processes the input signals from the pressure and temperature sensor portions 24 and 26, respectively, of the integrated pressure and temperature sensor 22, detects the fluid type, calculates the superheat of the fluid, and provides an output that identifies the level of the calculated superheat. The superheat processor 30 may also be configured to provide other data, such as fluid temperature, fluid pressure, fluid type, relevant historical dates maintained in an onboard memory (such as alarm and on-off history), and other desired information.

Advantageously, the superheat processor 30 maintains a high level of accuracy over a typical operating range of pressure and temperature after a one-time calibration. Non-limiting examples of suitable superheat processors include microcontrollers, Field Programmable Gate Arrays (FPGAs), and Application Specific Integrated Circuits (ASICs) with embedded and/or off-board memory and peripherals.

The PCB 28 includes a die aperture 82, and two fastener apertures 84. The PCB 28 may be attached to the fluid inlet member 18 with fasteners, such as threaded fasteners 86 (see FIG. 3) that extend through the fastener apertures 84 and into threaded bores 88 formed in the fluid inlet member 18.

As shown in FIG. 1, the pressure sensor die 46 is attached to the pedestal 42 of the fluid inlet member 40 by the solder preform 48. The pressure sensor die 46 may include a glass cover 50 bonded to an outwardly facing surface thereof (the upwardly facing surface when viewing FIG. 1). A lower surface of the pressure sensor die 46 defines a bonding surface 47 (the downwardly facing surface when viewing FIGS. 6 and 8). The known solder preform 48 may have any desired shape, and the pressure sensor die 46 may be aligned thereon by an assembler by visual positioning and hand placement, i.e., without the aid of alignment tools.

Figure 4:
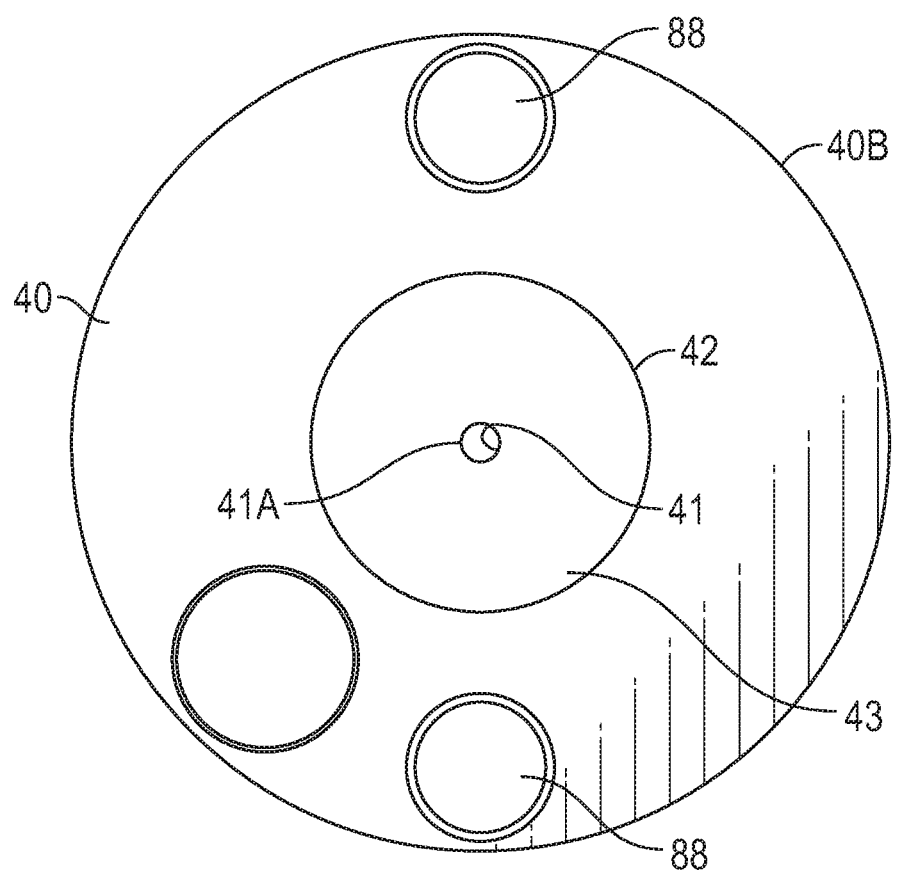
FIG. 4 is a top plan view of the fluid inlet member illustrated in FIG. 1.
Figure 5:
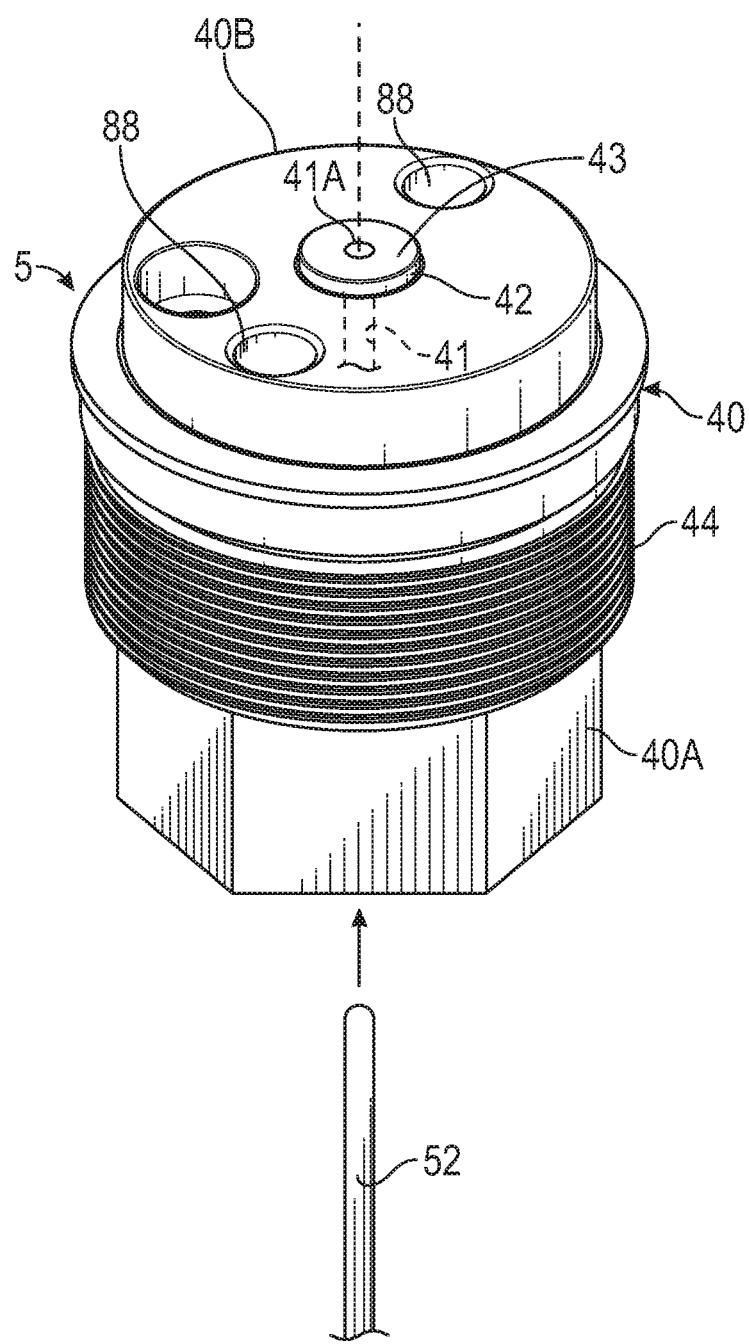
FIG. 5 is an enlarged perspective view of a portion of the fluid inlet member illustrated in FIGS. 1 and 4.

Referring now to FIGS. 4 and 5, a portion of the fluid inlet member 40 illustrated in FIG. 1 to which the method according to the invention may be applied is shown. As shown, a portion of the pressure port 41 formed through the pedestal 42 has a uniform diameter. In the remaining portion of the fluid inlet member 40, the bore defining the pressure port 41 may have a diameter equal to or larger than the diameter of the portion of the pressure port 41 formed through the pedestal 42.

In a first embodiment of the method of the invention, an elongated applicator 52 (see FIG. 5) may be coated with solder mask (not shown) and inserted into the pressure port 41 from the first axial end 40A of the fluid inlet member 40 (the lower end when viewing FIG. 5). It will be understood that the solder mask may be a liquid, such as a low viscosity liquid solder mask. The applicator 52 preferably has a diameter slightly smaller than an inside diameter of the pressure port 41 that when the applicator 52 is coated with the solder mask, the applicator 52 may be slidably inserted into the pressure port 41 so as to successfully coat an inside surface of the pressure port 41 and a small portion of the mounting surface 43 of the pedestal 42 around the periphery of the port opening 41A with a thin layer of the liquid solder mask. The elongated applicator 52 and the inlet member 40 thus define a solder mask coating assembly. The illustrated applicator 52 may be formed from stainless steel. Alternatively, the applicator 52 may be formed from any metal having a minimal and uniform oxide content, such as aluminum, or from rigid plastic. Additionally, an outside surface of the applicator 52 may have a finish configured to control an amount of liquid on the applicator 52 during insertion into the pressure port 41. Non-limiting examples of such finishes include very fine radial grooves, such as from a lathe operation, and micro-holes, such as from sandblasting.

As used herein, the small portion of the mounting surface 43 of the pedestal 42 around the periphery of the port opening 41A that will be coated with the thin layer of the liquid solder mask may be defined as an area that extends within about 0.05 mm to about 0.15 mm radially outward from a periphery of the port opening 41A. If desired, the applicator 52 coated with the solder mask may be slidably inserted into the pressure port 41 such that only the pressure port 41 is coated with the thin layer of the liquid solder mask.

Alternatively, the applicator 52 may be inserted into the pressure port 41 from a port opening 41A in the pedestal 42 at a second axial end 40B of the fluid inlet member 40 (the upper end when viewing FIG. 5). After being inserted into the pressure port 41, the applicator 52 may be immediately removed, such that the inside surface of the pressure port 41 and the small portion of the mounting surface 43 of the pedestal 42 around the periphery of the port opening 41A is coated with the thin layer of the liquid solder mask.

In the illustrated embodiment, the solder mask in and around the periphery of the port opening 41A of the pressure port 41 is configured to prevent solder from entering the pressure port 41 during solder re-flow.

The application of the low viscosity liquid solder mask to the inside surface of the pressure port 41 and around the periphery of the port opening 41A is configured to prevent the undesirable flow of solder from the solder preform 48 into the pressure port 41 during a solder re-flow operation. By preventing the flow of solder from the solder preform 48 into the pressure port 41 during a solder re-flow operation, a thicker, ductile solder preform 48 may be used. When cooled and hardened, such a thicker layer of solder preform 48 is configured to reduce torque sensitivity to the mounting surface 43.

Figure 6:
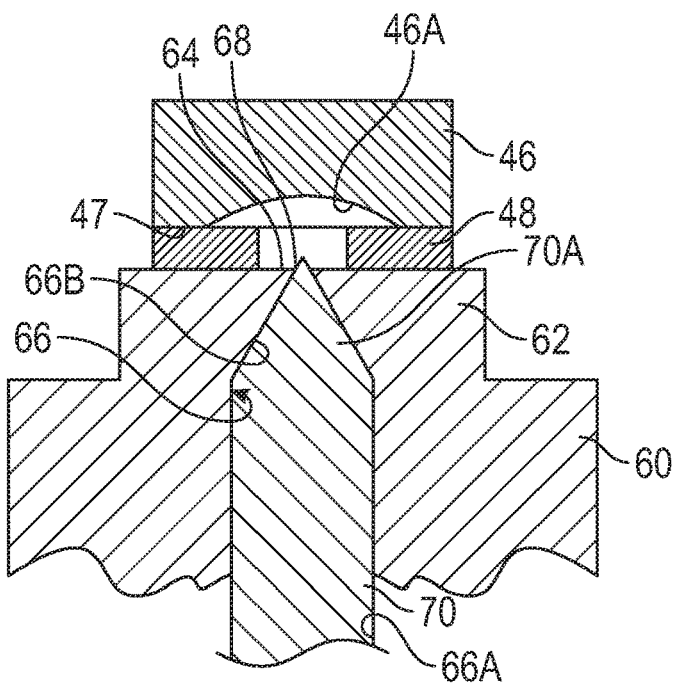
FIG. 6 is an elevational view in cross-section of a second embodiment of a fluid inlet member according to the invention and to which the method of the invention may be applied.
Figure 7:
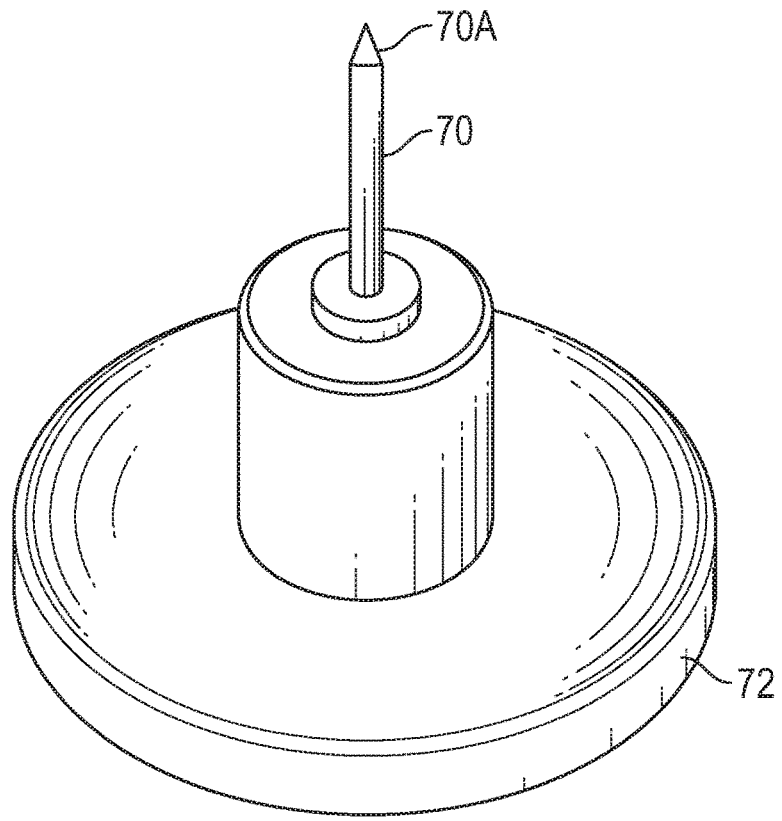
FIG. 7 is a perspective view of the applicator illustrated in FIG. 6.

Referring now to FIGS. 6 and 7, a second embodiment of a structure to which the first embodiment of the method according to the invention may be applied is shown. A portion of a fluid inlet member 60 is shown in FIG. 6 and is similar to the fluid inlet member 40 shown in FIGS. 1, 4, and 5. The fluid inlet member 60 includes a substantially cylindrical pedestal 62 formed on a first end thereof. The pedestal 62 includes a mounting surface 64. The fluid inlet member 60 may also include a central portion (not shown) that may include external threads, as shown at 44 in FIG. 1.

A pressure port 66 is formed in the fluid inlet member 60 from the mounting surface 64 of the pedestal 62 to a first end (not shown) of the fluid inlet member 60. Like the pressure port 41, the pressure port 66 is configured as a bore having a port opening 68, and may convey pressurized fluid to be measured through the fluid inlet member 60, through a hermetic seal defined by the solder preform 48, and into the pressure sensing chamber 46A of the MEMS pressure sensor die 46.

The pressure port 66 includes a first portion 66A (the lower portion when viewing FIG. 6) having a uniform diameter. A second portion 66B (the upper portion when viewing FIG. 6) of the pressure port 66 is tapered from the first portion 66A to the mounting surface 64 of the pedestal 62. An elongated applicator 70 may be configured as a pin, as shown in FIGS. 6 and 7, having a tapered first end 70A corresponding to the tapered second portion 66B of the pressure port 66. As shown in FIG. 7, the applicator 70 may be mounted to a base 72. The illustrated applicator 70 may be formed from stainless steel. Alternatively, the applicator 70 may be formed from any metal having a minimal and uniform oxide content, such as aluminum, or from rigid plastic. Additionally, an outside surface of the applicator 70 may have a finish configured to control an amount of liquid on the applicator 70 during insertion into the pressure port 66, as described in detail above.

As described above, the applicator 70 may be coated with the liquid solder mask (not shown) and inserted into the pressure port 66 from the first end of the fluid inlet member 60 (the lower end when viewing FIG. 6. After being inserted into the pressure port 66, the applicator 70 may be immediately removed, such that the pressure port 66 and a small portion of the mounting surface 64 of the pedestal 62 around the periphery of the port opening 68 is coated with a thin layer of the liquid solder mask. Preferably, the small portion of the mounting surface 64 of the pedestal 62 around the periphery of the port opening 68 that will be coated with the thin layer of the liquid solder mask may be defined as an area that extends within about 0.05 mm to about 0.15 mm radially outward from a periphery of the port opening 68. This solder mask in and around the periphery of the port opening 68 of the pressure port 66 is configured to prevent solder from entering the pressure port 66 during solder re-flow.

Figure 8:
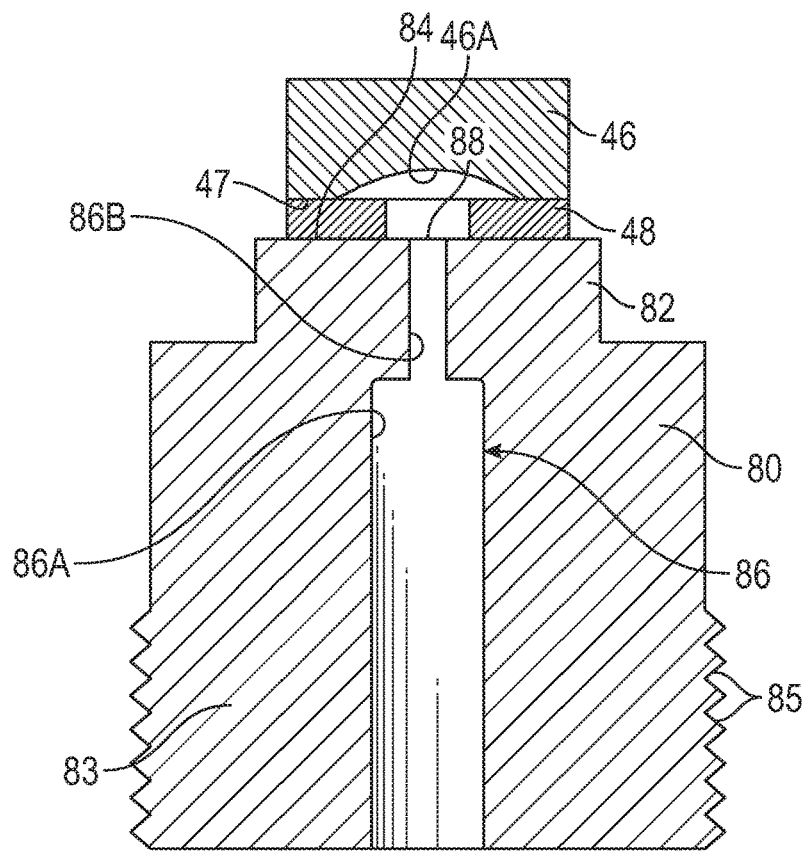
FIG. 8 is an elevational view in cross-section of a third embodiment of a fluid inlet member according to the invention and to which the method of the invention may be applied.
Figure 9:
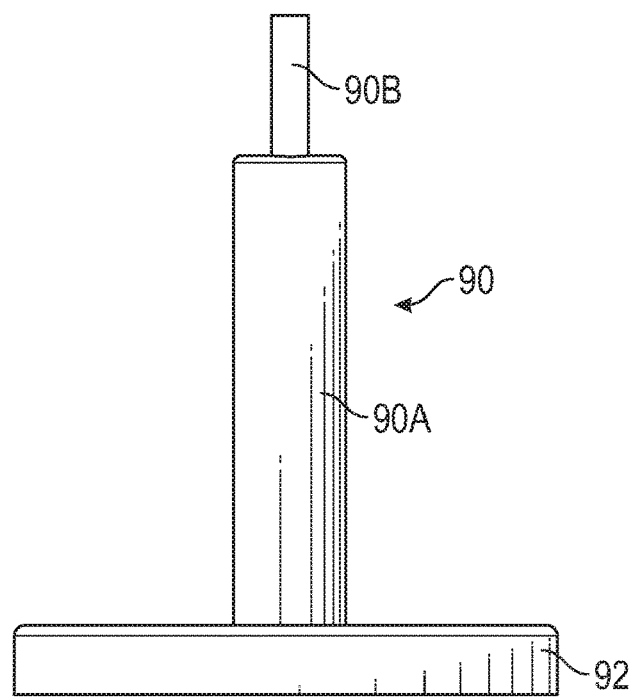
FIG. 9 is an elevational view of an applicator configured for use with the fluid inlet member illustrated in FIG. 8.
Figure 10:
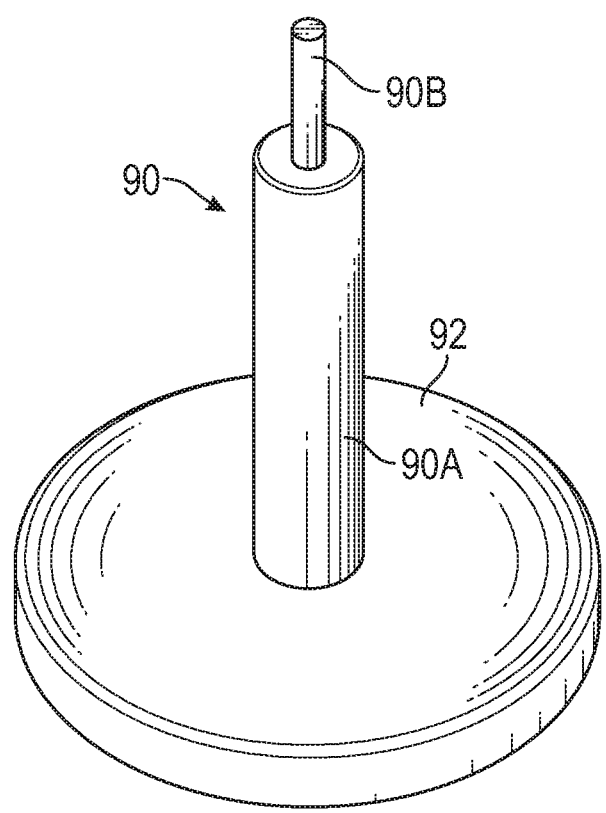
FIG. 10 is a perspective view of the applicator illustrated in FIG. 9.

Referring now to FIGS. 8 through 10, a third embodiment of a structure to which the first embodiment of the method according to the invention may be applied is shown. As shown in FIG. 8, a portion of a fluid inlet member 80 is shown and is similar to the fluid inlet member 60 shown in FIG. 6. The fluid inlet member 80 includes a substantially cylindrical pedestal 82 formed on a first end thereof. The pedestal 82 includes a mounting surface 84. The fluid inlet member 80 may also include a central portion 83 that may include external threads 85.

A pressure port 86 is formed in the fluid inlet member 80 from the mounting surface 84 of the pedestal 82 to a first end (not shown) of the fluid inlet member 80. Like the pressure port 66, the pressure port 86 is configured as a bore having a port opening 88, and may convey pressurized fluid to be measured through the fluid inlet member 80, through a hermetic seal defined by the solder preform 48, and into the pressure sensing chamber 46A of the MEMS pressure sensor die 46.

The pressure port 86 includes a first portion 86A (the lower portion when viewing FIG. 8) having a first uniform diameter. A second portion 86B (the upper portion when viewing FIG. 8) of the pressure port 86 has a second uniform diameter smaller than the diameter of the first portion 86A. The second portion 86B extends from the first portion 86A to the mounting surface 84 of the pedestal 82. An applicator 90 may be configured as a pin, as shown in FIG. 9, having a cylindrical first end 90A and a cylindrical second end 90B corresponding to the second portion 86B of the pressure port 86. As shown in FIG. 9, the applicator 90 may be mounted to a base 92. The illustrated applicator 90 may be formed from stainless steel. Alternatively, the applicator 90 may be formed from any metal having a minimal and uniform oxide content, such as aluminum, or from rigid plastic. Additionally, an outside surface of the applicator 90 may have a finish configured to control an amount of liquid on the applicator 90 during insertion into the pressure port 86, as described in detail above.

As described above, the applicator 90 may be coated with the liquid solder mask (not shown) and inserted into the pressure port 86 from the first end of the fluid inlet member 80 (the lower end when viewing FIG. 7. After being inserted into the pressure port 86, the applicator 90 may be immediately removed, such that the pressure port 86 and a small portion of the mounting surface 84 of the pedestal 82 around the periphery of the port opening 88 is coated with a thin layer of the liquid solder mask. Preferably, the small portion of the mounting surface 84 of the pedestal 82 around the periphery of the port opening 88 that will be coated with the thin layer of the liquid solder mask may be defined as an area that extends within about 0.05 mm to about 0.15 mm radially outward from a periphery of the port opening 88. This solder mask in and around the periphery of the port opening 88 of the pressure port 86 is configured to prevent solder from entering the pressure port 86 during solder re-flow.

In a second embodiment of the method of the invention, rather than applying a liquid solder mask to the pressure ports 41, 66, and 86, and the periphery of the port openings 41A, 68, and 88, the brass material of the fluid inlet members 40, 60, and 80 within the pressure ports 41, 66, and 86 and/or about the periphery of the port openings 41A, 68, and 88, may be selectively oxidized. Alternatively, an oxidized metal, such as aluminum oxide or titanium oxide, may be applied to a surface of the fluid inlet members 40, 60, and 80 within the pressure ports 41, 66, and 86 and/or about the periphery of the port openings 41A, 68, and 88. As described above, the area about the periphery of the port openings 41A, 68, and 88 that will preferably have the oxidized metal applied may be defined as an area that extends within about 0.05 mm to about 0.15 mm radially outward from a periphery of the port openings 41A, 68, and 88.

In a third embodiment of the method of the invention, rather than applying a liquid solder mask to the pressure ports 41, 66, and 86, and the periphery of the port openings 41A, 68, and 88, the brass material of the fluid inlet members 40, 60, and 80 within the pressure ports 41, 66, and 86 and/or about the periphery of the port openings 41A, 68, and 88, may be coated with nickel. Additionally, the brass material of the fluid inlet members 40, 60, and 80 within the pressure ports 41, 66, and 86 and/or about the periphery of the port openings 41A, 68, and 88, may be coated with other non-flowable plating material. Non-limiting examples of such other non-flowable plating materials include aluminum, chromium, and titanium.

In a fourth embodiment of the method of the invention, rather than applying a liquid solder mask to the pressure ports 41, 66, and 86, and the periphery of the port openings 41A, 68, and 88, a pin such as a pin having the same shape as the applicator 90 illustrated in FIG. 9, may be positioned in, and remain in, the pressure ports 41, 66, and 86 during the solder application and re-flow operations. This pin 90 will have a size and shape configured to block the port openings 41A, 68, and 88 such that solder is prevented from entering the port openings 41A, 68, and 88, and will be removed after the solder re-flow has solidified. When used as a pin to prevent solder from entering the port openings 41A, 68, and 88, the applicator 90 may be formed from stainless steel. Alternatively, the applicator 90 may be formed from any metal having a minimal and uniform oxide content, such as aluminum, or may be formed from any desired non-wettable material that is able to withstand the heat of the soldering operation.

The principle and mode of operation of this invention have been explained and illustrated in its preferred embodiments. However, it must be understood that this invention may be practiced otherwise than as specifically explained and illustrated without departing from its spirit or scope.

What is claimed is:

1. A method of attaching a Micro Electro Mechanical Systems (MEMS) die to a mounting surface, the method comprising:
    coating an inside surface of a pressure port of a fluid inlet member with a layer of solder mask, the fluid inlet member having a first axial end, a second axial end, and a port opening of the pressure port formed in the second axial end of the fluid inlet member;
    disposing a solder preform on the mounting surface of the fluid inlet member;
    disposing a MEMS die on the solder preform; and
    heating the solder preform in a re-flow operation to attach the MEMS die to the mounting surface;
    wherein the solder mask within the pressure port prevents molten solder from entering the pressure port during the re-flow operation.

2. The method of attaching a MEMS die to a mounting surface according to claim 1, wherein the coating step further includes coating a portion of a mounting surface of the fluid inlet member around a periphery of the port opening of the pressure port with a layer of the solder mask, and wherein the solder mask on the mounting surface of the fluid inlet member around a periphery of the port opening of the pressure port further prevents molten solder from entering the pressure port during the re-flow operation.

3. The method of attaching a MEMS die to a mounting surface according to claim 1, wherein the coating step includes inserting an elongated applicator coated with a liquid solder mask into the pressure port.

4. The method of attaching a MEMS die to a mounting surface according to claim 2, wherein the coating step includes inserting an elongated applicator coated with a liquid solder mask into the pressure port.

5. The method of attaching a MEMS die to a mounting surface according to claim 4, further including inserting the elongated applicator into the pressure port from the first axial end of the fluid inlet member.

6. The method of attaching a MEMS die to a mounting surface according to claim 4, further including inserting the elongated applicator into the port opening formed in the second axial end of the fluid inlet member.

7. The method of attaching a MEMS die to a mounting surface according to claim 4, wherein the portion of the mounting surface of the fluid inlet member around the periphery of the port opening is defined as an area that extends within about 0.05 mm to about 0.15 mm radially outward from a periphery of the port opening.

8. A method of attaching a MEMS die to a mounting surface, the method comprising:
    oxidizing an inside surface of a pressure port and a portion of a mounting surface of a metal fluid inlet member around a periphery of a port opening of the pressure port, the fluid inlet member having a first axial end and a second axial end, the port opening formed in the second axial end of the fluid inlet member;
    disposing a solder preform on the mounting surface of the fluid inlet member;
    disposing a MEMS die on the solder preform; and
    heating the solder preform in a re-flow operation to attach the MEMS die to the mounting surface;
    wherein the oxidized surface within the pressure port and the oxidized portion of the mounting surface of the fluid inlet member around the periphery of the port opening prevents molten solder from entering the pressure port during the re-flow operation.

9. The method of attaching a MEMS die to a mounting surface according to claim 8, wherein the oxidizing step is accomplished by applying an oxidized metal to the inside surface of the pressure port and to the portion of the mounting surface around a periphery of the port opening of the pressure port.

10. The method of attaching a MEMS die to a mounting surface according to claim 8, wherein the portion of the mounting surface of the fluid inlet member around the periphery of the port opening is defined as an area that extends within about 0.05 mm to about 0.15 mm radially outward from a periphery of the port opening.

11. A method of attaching a MEMS die to a mounting surface, the method comprising:
coating an inside surface of a pressure port and a portion of a mounting surface of a metal fluid inlet member around a periphery of a port opening of the pressure port with a non-flowable plating material, the fluid inlet member having a first axial end and a second axial end, the port opening formed in the second axial end of the fluid inlet member;
disposing a solder preform on the mounting surface of the fluid inlet member;
disposing a MEMS die on the solder preform; and
heating the solder preform in a re-flow operation to attach the MEMS die to the mounting surface;
wherein the non-flowable plating material within the pressure port and the non-flowable plating material on the portion of the mounting surface of the fluid inlet member around the periphery of the port opening prevents molten solder from entering the pressure port during the re-flow operation.

12. The method of attaching a MEMS die to a mounting surface according to claim 11, wherein the non-flowable plating material is nickel.

13. The method of attaching a MEMS die to a mounting surface according to claim 11, wherein the portion of the mounting surface of the fluid inlet member around the periphery of the port opening is defined as an area that extends within about 0.05 mm to about 0.15 mm radially outward from a periphery of the port opening.

14. A method of attaching a MEMS die to a mounting surface, the method comprising:
inserting a pin into a pressure port of a fluid inlet member having a first axial end and a second axial end, a port opening of the pressure port formed in the second axial end of the fluid inlet member;
disposing a solder preform on a mounting surface of the fluid inlet member;
disposing a MEMS die on the solder preform; and
heating the solder preform in a re-flow operation to attach the MEMS die to the mounting surface;
wherein the pin within the pressure port is configured to close the pressure port and prevent molten solder from entering the pressure port through the port opening during the re-flow operation.

15. The method of attaching a MEMS die to a mounting surface according to claim 4, wherein the portion of the mounting surface of the fluid inlet member around the periphery of the port opening is defined as an area that extends within about 0.05 mm to about 0.15 mm radially outward from a periphery of the port opening.

* * * * *